United States Patent
Tang et al.

(10) Patent No.: US 8,501,629 B2
(45) Date of Patent: Aug. 6, 2013

(54) SMOOTH SICONI ETCH FOR SILICON-CONTAINING FILMS

(75) Inventors: Jing Tang, Santa Clara, CA (US); Nitin Ingle, Santa Clara, CA (US); Dongqing Yang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 395 days.

(21) Appl. No.: 12/646,030

(22) Filed: Dec. 23, 2009

(65) Prior Publication Data
US 2011/0151674 A1    Jun. 23, 2011

(51) Int. Cl.
*H01L 21/302* (2006.01)

(52) U.S. Cl.
USPC ........... 438/715; 438/707; 438/708; 438/723; 438/743; 216/22; 216/277; 216/66; 216/67

(58) Field of Classification Search
USPC ........... 438/707, 708, 715, 723, 743; 216/22, 216/27, 66, 67
See application file for complete search history.

(56) References Cited

U.S. PATENT DOCUMENTS

| | | | | |
|---|---|---|---|---|
| 5,789,300 | A * | 8/1998 | Fulford, Jr. | 438/301 |
| 6,238,582 | B1 | 5/2001 | Williams et al. | |
| 6,403,491 | B1 * | 6/2002 | Liu et al. | 438/710 |
| 6,903,511 | B2 * | 6/2005 | Chistyakov | 315/111.71 |
| 7,183,214 | B2 * | 2/2007 | Nam et al. | 438/694 |
| 7,196,342 | B2 * | 3/2007 | Ershov et al. | 250/504 R |
| 7,581,511 | B2 * | 9/2009 | Mardian et al. | 118/723 MW |
| 7,628,897 | B2 | 12/2009 | Mungekar et al. | |
| 2005/0230350 | A1 | 10/2005 | Kao et al. | |
| 2008/0182382 | A1 | 7/2008 | Ingle et al. | |
| 2009/0104782 | A1 * | 4/2009 | Lu et al. | 438/715 |
| 2009/0275206 | A1 | 11/2009 | Katz et al. | |

FOREIGN PATENT DOCUMENTS

WO    WO 2011/087580 A1    7/2011

OTHER PUBLICATIONS

Notification of Transmittal of the International Search Report and the Written Opinion of the International Searching Authority, or the Declaration; International Search Report and Written Opinion of the International Searching Authority for corresponding International Application No. PCT/US2010/057676 mailed Jun. 27, 2011, 9 pages.

* cited by examiner

*Primary Examiner* — Lan Vinh
*Assistant Examiner* — Maki Angadi
(74) *Attorney, Agent, or Firm* — Kilpatrick Townsend & Stockton LLP (57) ABSTRACT

A method of etching silicon-containing material is described and includes a SiConi™ etch having a greater or lesser flow ratio of hydrogen compared to fluorine than that found in the prior art. Modifying the flow rate ratios in this way has been found to reduce roughness of the post-etch surface and to reduce the difference in etch-rate between densely and sparsely patterned areas. Alternative means of reducing post-etch surface roughness include pulsing the flows of the precursors and/or the plasma power, maintaining a relatively high substrate temperature and performing the SiConi™ in multiple steps. Each of these approaches, either alone or in combination, serve to reduce the roughness of the etched surface by limiting solid residue grain size.

22 Claims, 7 Drawing Sheets

SMOOTH SICONI ETCH FOR SILICON-CONTAINING FILMS

FIELD OF THE INVENTION

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the first material. As a result of the diversity of materials, circuits and processes, etch processes have been developed with a selectivity towards a variety of materials.

A SiConi™ etch is a remote plasma assisted dry etch process which involves the simultaneous exposure of a substrate to $H_2$, $NF_3$ and $NH_3$ plasma by-products. Remote plasma excitation of the hydrogen and fluorine species allows plasma-damage-free substrate processing. The SiConi™ etch is largely conformal and selective towards silicon oxide layers but does not readily etch silicon regardless of whether the silicon is amorphous, crystalline or polycrystalline. The selectivity provides advantages for applications such as shallow trench isolation (STI) and inter-layer dielectric (ILD) recess formation.

The SiConi™ process produces solid by-products which grow on the surface of the substrate as substrate material is removed. The solid by-products are subsequently removed via sublimation when the temperature of the substrate is raised. However, as technology shrinks to 32 nm trench widths and beyond, the dimensions of these solid by-products become non-negligible compared with the smallest dimension of the trench. The appreciable size of the solid by-products may pose challenges relating to ILD recess surface roughness and trench-to-trench variability of the height of the silicon oxide interface.

Methods are needed to reduce surface roughness and height variability in SiConi™ etch processes.

BRIEF SUMMARY OF THE INVENTION

A method of etching silicon-containing material is described and includes a SiConi™ etch having a greater or lesser flow ratio of hydrogen compared to fluorine than that found in the prior art. Modifying the flow rate ratios in this way has been found to reduce roughness of the post-etch surface and to reduce the difference in etch-rate between densely and sparsely patterned areas. Alternative means of reducing post-etch surface roughness include pulsing the flows of the precursors and/or the plasma power, maintaining a relatively high substrate temperature and performing the SiConi™ in multiple steps. Each of these approaches, either alone or in combination, serve to reduce the roughness of the etched surface by limiting solid residue grain size.

In one embodiment, a method of etching a silicon-containing layer on a surface of a substrate in a substrate processing region of a substrate processing chamber, which leaves a relatively smooth post-etch surface, includes flowing a fluorine-containing precursor and a hydrogen-containing precursor into a first remote plasma region fluidly coupled to the substrate processing region while forming a plasma in the first plasma region to produce plasma effluents. The flow rate of the fluorine-containing precursor and the flow rate of the hydrogen-containing precursor result in a hydrogen-to-fluorine atomic flow ratio of less than 1:1 or greater than 5:1. The method further includes etching the silicon-containing layer by flowing the plasma effluents into the substrate processing region while forming solid by-products on the surface of the substrate, and sublimating the solid by-products to leave the relatively smooth post-etch surface by increasing a temperature of the substrate above a sublimation temperature of the solid by-products.

In yet another embodiment, a method of etching a silicon-containing layer on a surface of a substrate in a substrate processing region of a substrate processing chamber, which reduces a difference in etch-rate between a densely patterned area and a sparsely patterned area, includes flowing a fluorine-containing precursor and a hydrogen-containing precursor into a first remote plasma region fluidly coupled to the substrate processing region while forming a plasma in the first plasma region to produce plasma effluents. The flow rate of the fluorine-containing precursor and The flow rate of the hydrogen-containing precursor result in a hydrogen-to-fluorine atomic flow ratio of less than 1:1 or greater than 5:1. The method further includes etching the silicon-containing layer in the densely patterned area and the sparsely patterned area by flowing the plasma effluents into the substrate processing region while forming solid by-products on the surface of the substrate, and sublimating the solid by-products by increasing a temperature of the substrate above a sublimation temperature of the solid by-products.

In yet another embodiment, a method of etching a silicon-containing layer on a surface of a substrate in a substrate processing region of a substrate processing chamber includes flowing fluorine-containing precursor and a hydrogen-containing precursor into a first remote plasma region fluidly coupled to the substrate processing region while forming a plasma in the first plasma region to produce plasma effluents. The flow of at least one of the precursors comprises flow pulses. The method further includes etching the silicon-containing layer by flowing the plasma effluents into the substrate processing region while forming solid by-products on the surface of the substrate, and sublimating the solid by-products by increasing a temperature of the substrate above a sublimation temperature of the solid by-products.

In yet another embodiment, a method of etching a silicon-containing layer on a surface of a substrate in a substrate processing region of a substrate processing chamber includes flowing a fluorine-containing precursor and a hydrogen-containing precursor into a first remote plasma region fluidly coupled to the substrate processing region while forming a train of plasma pulses in the first plasma region to produce plasma effluents; etching the silicon-containing layer by flowing the plasma effluents into the substrate processing region while forming solid by-products on the surface of the substrate; and sublimating the solid by-products by increasing a temperature of the substrate above a sublimation temperature of the solid by-products.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

A method of etching silicon-containing material is described and includes a SiConi™ etch having a greater or lesser flow ratio of hydrogen compared to fluorine than that found in the prior art. Modifying the flow rate ratios in this way has been found to reduce roughness of the post-etch surface and to reduce the difference in etch-rate between densely and sparsely patterned areas. Alternative means of reducing post-etch surface roughness include pulsing the flows of the precursors and/or the plasma power, maintaining a relatively high substrate temperature and performing the SiConi™ in multiple steps. Each of these approaches, either alone or in combination, serve to reduce the roughness of the etched surface by limiting solid residue grain size.

SiConi™ etch processes have used a hydrogen source of ammonia ($NH_3$) and a fluorine source of nitrogen trifluoride ($NF_3$) which together flow through a remote plasma system (RPS) and into a reaction region. In the past, SiConi™ etch processes have been optimized to efficiently use the supplies of fluorine and hydrogen. An ammonia flow rate twice that of nitrogen trifluoride has been used to produce a high etch rate which translates more generally to a hydrogen-to-fluorine atomic flow ratio of about 2:1. Modifying one or both of the flow rates so the hydrogen (at. %) flow rate is either greater or less than twice the fluorine (at. %) flow rate has been found to reduce the roughness of an etched silicon-containing surface. Hydrogen-to-fluorine atomic flow ratios are less than 1:1, less than 1:2, less than 1:4, greater than 5:1, greater than 10:1 and greater than 20:1 in different embodiments.

Without binding the coverage of the claims to hypothetical process mechanisms, modifying the flow rate ratio to either a "hydrogen-starved" regime or "fluorine-starved" regime is thought to increase the density of viable solid residue nucleation sites. The larger number of nucleation sites may result in a reduction in size of the average grain of solid residue upon completion of an etch step. The smaller grain sizes reduce screening of the etch process and other grain size effects resulting in a reduction in spatial variation of etch rate across a silicon-containing layer.

Figure 1:
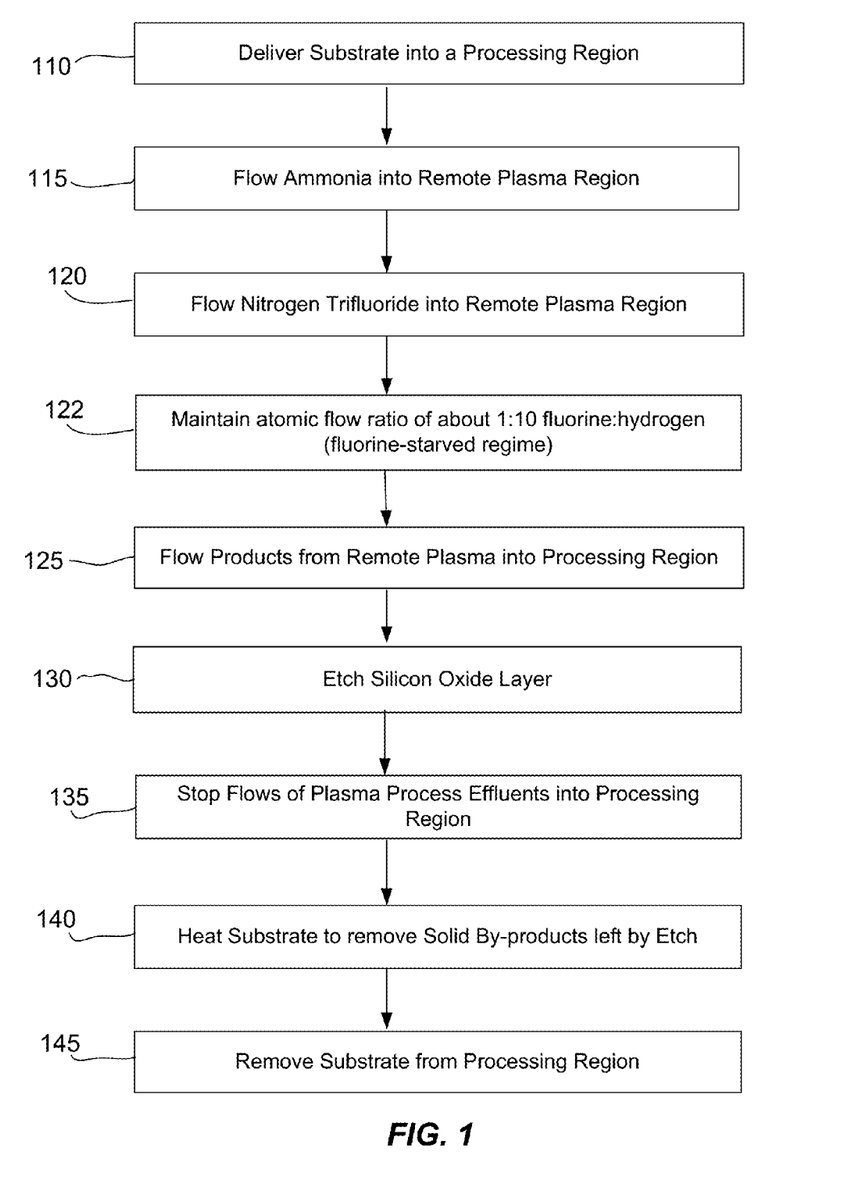
FIG. 1 is a flow chart of a silicon-containing material etch process according to disclosed embodiments.

In order to better understand and appreciate the invention, reference is now made to FIG. 1 which is a flow chart of a fluorine-starved SiConi™ etch process according to disclosed embodiments. The process begins when a substrate is transferred into a processing chamber (operation 110). A silicon oxide layer is present on the surface of the substrate. Flows of ammonia and nitrogen trifluoride are initiated into a plasma region separate from the processing region (operations 115 and 120). The separate plasma region may be referred to as a remote plasma region herein and may be a distinct module from the processing chamber or a compartment within the processing chamber. The flows of ammonia and nitrogen trifluoride are controlled such that the hydrogen-to-fluorine atomic flow ratio is maintained at about 10:1 (operation 122). Remote plasma effluents or products from the remote plasma are flowed into the processing region and allowed to interact with the substrate surface (operation 125). The layer is etched (operation 130) and the flows of the gases are stopped (operation 135). The substrate is heated to sublimate the solid by-products left by etch process (operation 140) and the substrate is removed from the processing region (operation 145).

Figure 2:
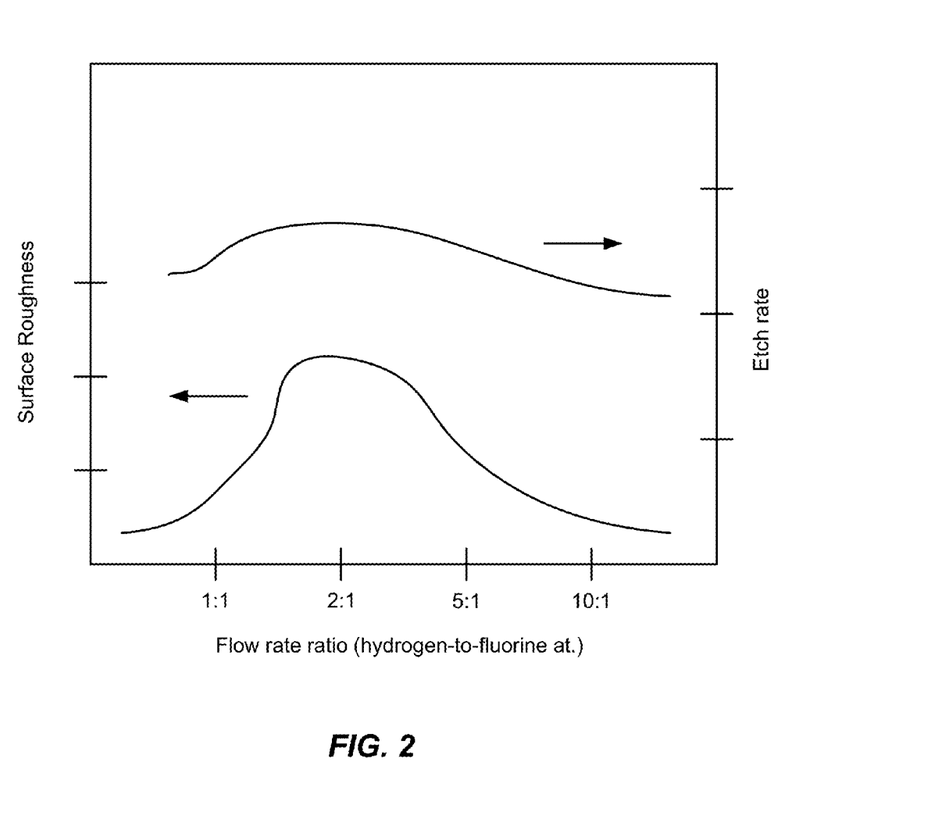
FIG. 2 is a plot indicating the dependence of surface roughness and etch rate on hydrogen-to-fluorine flow ratio for SiConi™ etch processes according to disclosed embodiments.

FIG. 2 shows the etch rate during a SiConi™ etch and the roughness of the surface following sublimation for a variety of hydrogen-to-fluorine atomic flow rate ratios. The surface roughness is highest near a 2:1 hydrogen-to-fluorine ratio and drops in the hydrogen starved regime (left of the peak) but also in the fluorine-starved regime (right of the peak). The etch rate is less dependent on the flow rate ratio which makes the flow rate ratio a useful parameter to control the surface roughness. As the ratio is raised further than that shown in the figure, the fluorine concentration drops such that the etch rate collapses. For low flow rate ratios, etching continues due to the continued availability of fluorine. Surface roughness measurements were made with an AFM operated in tapping mode. AFM measurements were made on a square pattern of dimension 1 μm×1 μm and surface roughness measurements indicated in FIG. 2 were determined from an rms calculation of all measured points.

Figure 3A:
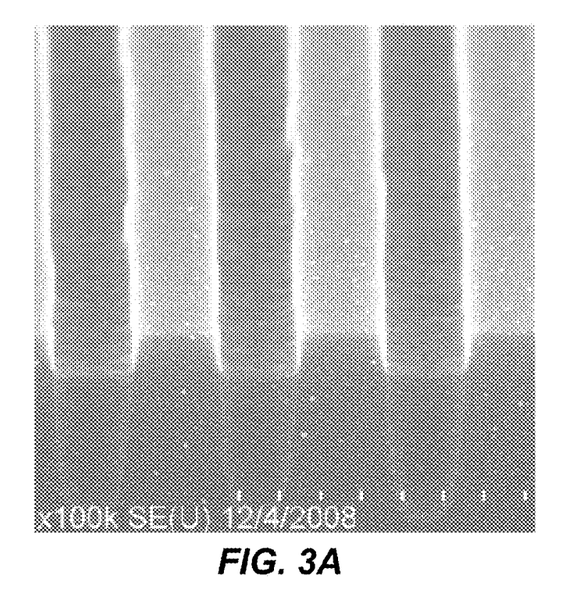
FIGS. 3A-3B depict patterned surfaces following a standard SiConi™ and following a smooth-SiConi™ according to disclosed embodiments.
Figure 3B:
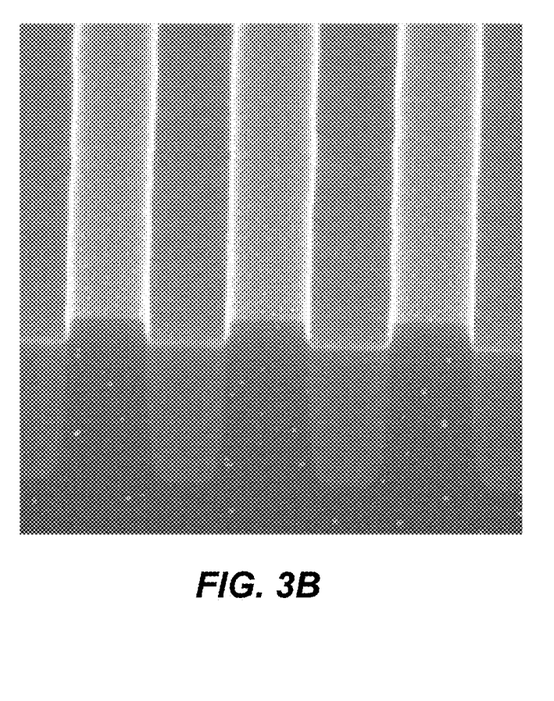

FIG. 3 depicts the roughness following a standard SiConi™ (FIG. 3A) and following a smooth SiConi™ according to disclosed embodiments (FIG. 3B). Texture (surface roughness) is clearly visible along the silicon oxide filled trench in FIG. 3A. To foal the patterned surface shown in FIG. 3B, a smooth SiConi™ was performed involving a flow of ammonia at 350 sccm and $NF_3$ at 35 sccm. This represents the fluorine-starved regime on the right-hand-side of FIG. 2. Texture along the silicon oxide filled trenches is hard to discern in FIG. 3B. The lack of texture in the picture reflects a lack of surface roughness resulting from a smaller size of solid residue grain created during the etch prior to sublimation. Both of FIGS. 3A-3B represent surfaces following sublimation of the solid residue. The temperature of the patterned substrate was 30° C. during the etch operation and the substrate temperature was raised to 100° C. to sublimate the solid residue in each of FIGS. 3A-3B.

Figure 4:
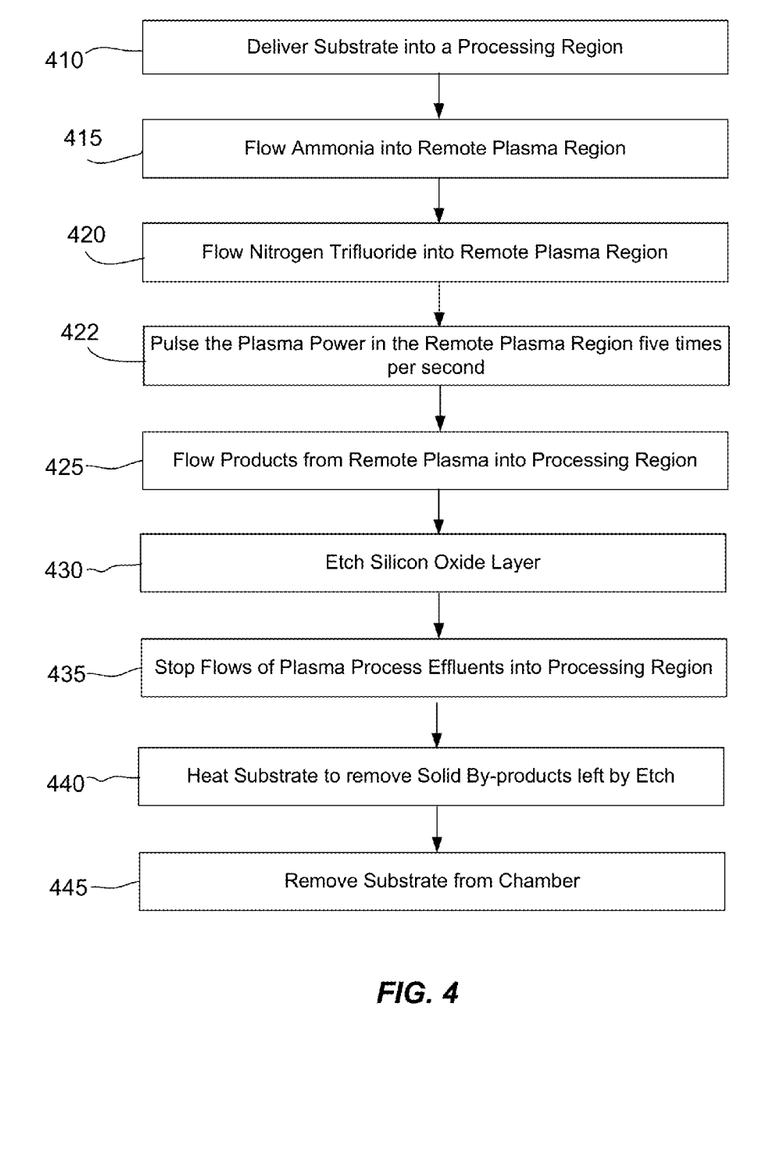
FIG. 4 is a flow chart of a silicon-containing material etch process according to disclosed embodiments.

Pulsing the applied plasma power or pulsing the flows of either or both precursors also results in a smoother post-etch surface by the same mechanism. While not limiting claim coverage by any particular theory of operation, the inventors believe such pulsing produces a higher density of solid by-product nucleation sites as well. A pulsed plasma process is shown in FIG. 4. The process begins similarly to the process depicted in FIG. 1, when a substrate is transferred into a processing chamber (operation 410). A silicon oxide layer is present on the surface of the substrate. Flows of ammonia and nitrogen trifluoride are begun into the plasma region separate from the processing region (operations 415 and 420). This time the plasma power is pulsed with a repetition frequency of between about 0.1 Hz and about 1.0 Hz (operation 422). Remote plasma effluents are flowed into the processing region where they can interact with the substrate surface in operation 425. The layer is etched (operation 430) and then the flows of gases and remote plasma effluents into the processing region are stopped (operation 435). The substrate is heated to sublimate the solid by-products left by the etch process (operation 440) and the substrate is removed from the processing region (operation 445).

The SiConi™ etch may be performed in multiple steps to also reduce the roughness of the post-etch surface. A process to remove a total film thickness may proceed in two separate steps, each step including an abbreviated SiConi™ which removes 30% to 80% of the total film thickness. Each step includes an etch and an anneal to sublimate the solid residue. During a repeated SiConi™ process, the substrate may be maintained at a relatively high substrate temperature during the etch to allow a smaller temperature increase to sublimate the solid residue. The reduction in the differential heat required for sublimation allows the anneal step to be shortened, shortening the overall process and allowing a relatively high net throughput. A process to remove a total film thickness may proceed in more than two steps as well. For example, three, four or five steps may be used to remove the total film thickness by removing 20% to 40%, 15% to 35% or 10% to 20% of the total film thickness in each step, respectively. The anneal step may be less than about 30 seconds, less than about 20 seconds, less than about 10 seconds or less than about 5 seconds in different embodiments. A repeated SiConi™ process may be combined with any of the other techniques presented herein to further smooth the post-etch surface. Each step may remove less than or about 200 Å, less than or about 150 Å, less than or about 100 Å, less than or about 75 Å, less than or about 50 Å or less than or about 25 Å in different embodiments.

Figure 5A:
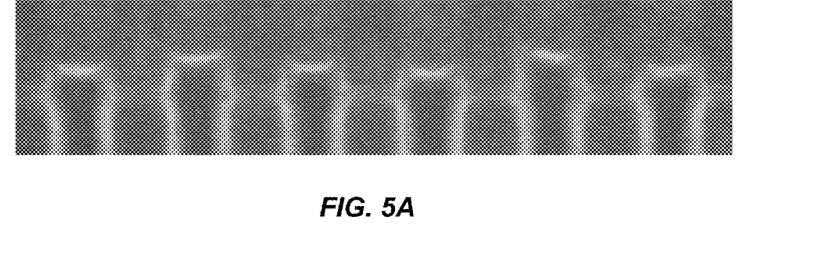
FIGS. 5A-5B depict patterned surfaces following a standard SiConi™ and following a smooth-SiConi™ according to disclosed embodiments.
Figure 5B:
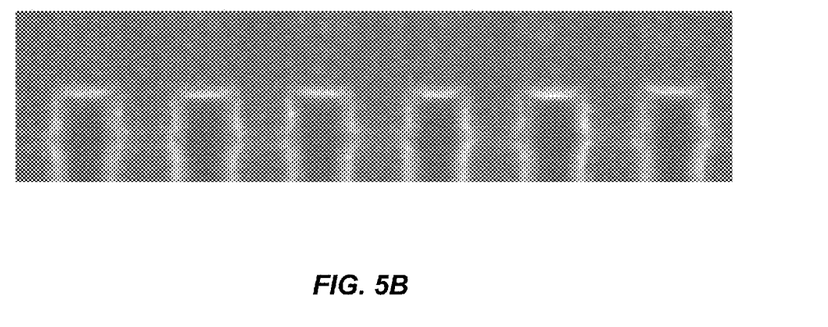

FIGS. 5A-5B depict patterned surfaces following a standard SiConi™ (FIG. 5A) and following a smooth-SiConi™ performed in multiple steps according to disclosed embodiments (FIG. 5B). Variability in height of silicon oxide interfaces is clearly visible among silicon oxide filled trenches in FIG. 5A. This type of variation occurs especially for narrow trenches by a mechanism similar to that which caused the surface roughness shown in FIG. 3A. To form the patterned surface shown in FIG. 5B, a smooth SiConi™ was performed in multiple steps, each configured to remove less material than a single step which resulted in the variability depicted in FIG. 5A. Variability in the heights of the silicon oxide interfaces is hard to discern in FIG. 5B. The lack of variability in the picture results from a smaller size of solid residue grain created during the etch prior to sublimation. The solid residue grain sizes has been reduced substantially below the widths of the trenches. Both of FIGS. 5A-5B represent surfaces following sublimation of the solid residue as well as some additional processing including deposition. The temperature of the patterned substrate was 30° C. during the etch operation and the substrate temperature was raised to 100° C. to sublimate the solid residue in each of FIGS. 5A-5B.

Techniques presented herein have been shown to lessen surface roughness and silicon oxide height variability in trenches. One of the root causes of these issues is the formation of crystals (solid by-product) from reaction between etchants and dielectric films. The crystal size is comparable to trench size for advanced nodes which, in combination with variable crystal orientation and nucleation site distribution and concentration, result in the aforementioned issues. The techniques presented herein address these issues by employing multiple etching reactions in a sequence, such that crystal growth is confined for a better local uniformity control. Sequential application of the SiConi™ etch as well as operating in hydrogen-starved or fluorine-starved regimes result in the formation of different etchants and leads to the formation of crystals with different sizes and porosities. By modifying the SiConi™ etch as described, a denser and locally more uniform crystal layer may be formed enabling a more uniform etch rate between trenches as well as within a single trench recess.

The methods described have other uses as well. Performing a traditional SiConi™ on a patterned substrate with some densely patterned areas and some more sparsely patterned areas may exhibit an etch rate differential between the two areas. The smooth-SiConi™ processes discussed herein result in a reduction in the etch rate differential and enhances the utility of the SiConi™ etch for patterned wafers having both open and dense silicon oxide areas. This effect may arise due to a similar mechanism to that which smoothed the post-etch surface in earlier examples. A higher density distribution of smaller solid-residue grains may allow smaller patches of dielectric (present in densely patterned areas) to appear more similar to open areas since the average separation between nucleation sites may become much smaller than the lateral dimensions of the smaller silicon-containing patches. The end result is that the difference in etch-rate between a densely patterned area and a sparsely patterned area is reduced.

Additional smooth-SiConi™ etch process parameters are disclosed in the course of describing an exemplary processing system.

Exemplary Processing System

Figure 6:
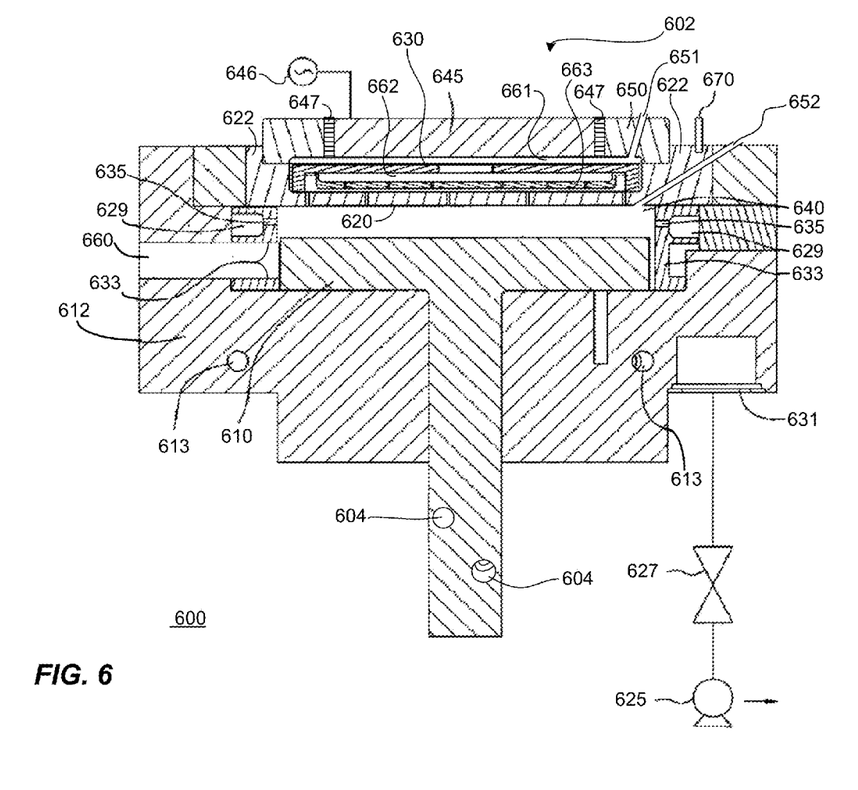
FIG. 6 is a cross-sectional view of a processing chamber for performing etch processes according to disclosed embodiments.

FIG. 6 is a partial cross sectional view showing an illustrative processing chamber 600, in which, embodiments of the invention may be carried out. Generally, a hydrogen-containing precursor and a fluorine-containing precursor may be introduced through one or more apertures 651 into remote plasma region(s) 661-663 and excited by plasma power source 646.

In one embodiment, the processing chamber 600 includes a chamber body 612, a lid assembly 602, and a support assembly 610. The lid assembly 602 is disposed at an upper end of the chamber body 612, and the support assembly 610 is at least partially disposed within the chamber body 612. The processing chamber 600 and the associated hardware are preferably formed from one or more process-compatible materials (e.g. aluminum, stainless steel, etc.).

Figure 7:
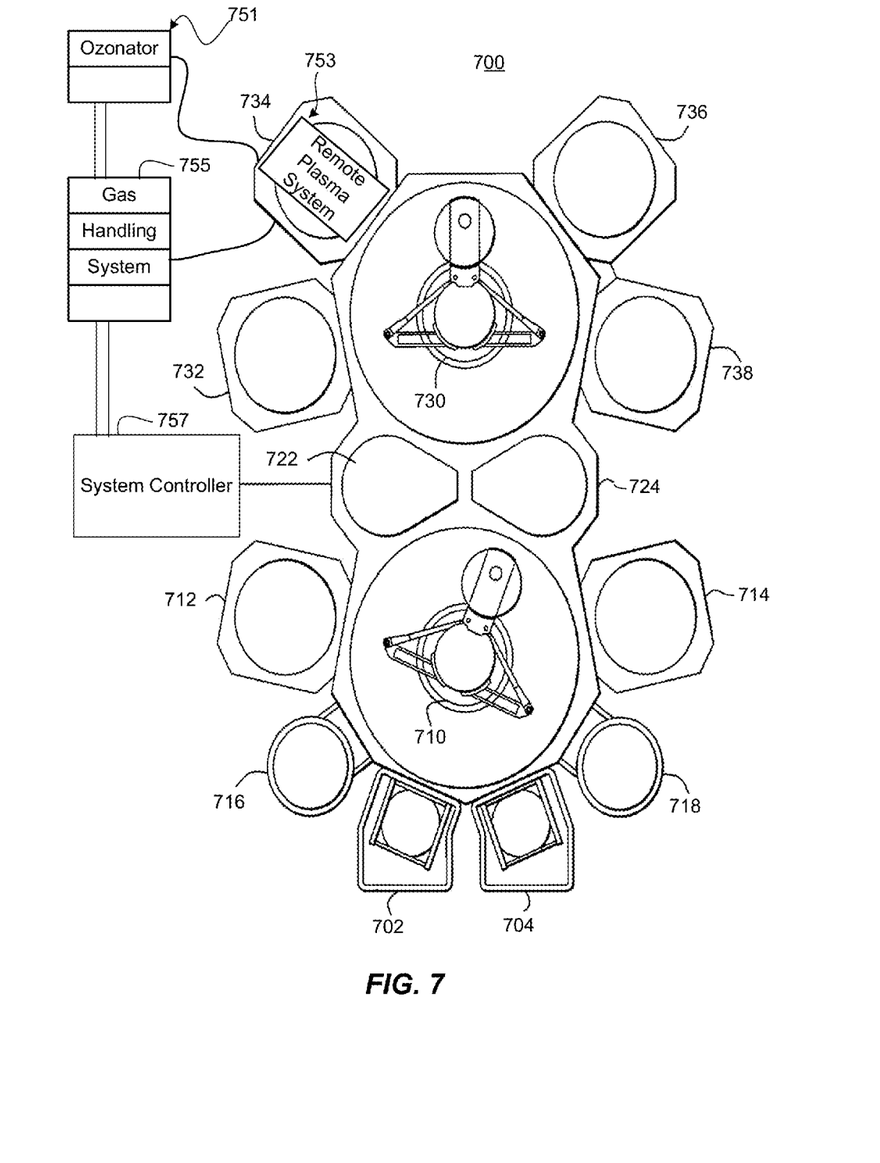
FIG. 7 is a processing system for performing etch processes according to disclosed embodiments.

The chamber body 612 includes a slit valve opening 660 formed in a sidewall thereof to provide access to the interior of the processing chamber 600. The slit valve opening 660 is selectively opened and closed to allow access to the interior of the chamber body 612 by a wafer handling robot (not shown). In one embodiment, a wafer can be transported in and out of the processing chamber 600 through the slit valve opening 660 to an adjacent transfer chamber and/or load-lock chamber, or another chamber within a cluster tool. An exemplary cluster tool which may include processing chamber 600 is shown in FIG. 7.

In one or more embodiments, chamber body 612 includes a chamber body channel 613 for flowing a heat transfer fluid through chamber body 612. The heat transfer fluid can be a heating fluid or a coolant and is used to control the temperature of chamber body 612 during processing and substrate transfer. Heating the chamber body 612 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 610 may have a support assembly channel 604 for flowing a heat transfer fluid through support assembly 610 thereby affecting the substrate temperature.

The chamber body 612 can further include a liner 633 that surrounds the support assembly 610. The liner 633 is preferably removable for servicing and cleaning. The liner 633 can be made of a metal such as aluminum, or a ceramic material. However, the liner 633 can be any process compatible material. The liner 633 can be bead blasted to increase the adhesion of any material deposited thereon, thereby preventing flaking of material which results in contamination of the processing chamber 600. In one or more embodiments, the liner 633 includes one or more apertures 635 and a pumping channel 629 formed therein that is in fluid communication with a vacuum system. The apertures 635 provide a flow path for gases into the pumping channel 629, which provides an egress for the gases within the processing chamber 600.

The vacuum system can include a vacuum pump 625 and a throttle valve 627 to regulate flow of gases through the processing chamber 600. The vacuum pump 625 is coupled to a vacuum port 631 disposed on the chamber body 612 and therefore, in fluid communication with the pumping channel 629 formed within the liner 633. The terms "gas" and "gases" are used interchangeably, unless otherwise noted, and refer to one or more reactants, catalysts, carrier, purge, cleaning, combinations thereof, as well as any other fluid introduced into the chamber body 612. The term "precursor" is used to refer to any process gas which takes part in a reaction to either remove or deposit material from a surface.

Apertures 635 allow the pumping channel 629 to be in fluid communication with a processing region 640 within the chamber body 612. The processing region 640 is defined by a lower surface of the lid assembly 602 and an upper surface of the support assembly 610, and is surrounded by the liner 633. The apertures 635 may be uniformly sized and evenly spaced about the liner 633. However, any number, position, size or shape of apertures may be used, and each of those design parameters can vary depending on the desired flow pattern of gas across the substrate receiving surface as is discussed in more detail below. In addition, the size, number and position of the apertures 635 are configured to achieve uniform flow of gases exiting the processing chamber 600. Further, the aperture size and location may be configured to provide rapid or high capacity pumping to facilitate a rapid exhaust of gas from the chamber 600. For example, the number and size of apertures 635 in close proximity to the vacuum port 631 may be smaller than the size of apertures 635 positioned farther away from the vacuum port 631.

A gas supply panel (not shown) is typically used to provide process gas(es) to the processing chamber 600 through one or more apertures 651. The particular gas or gases that are used depend upon the process or processes to be performed within the chamber 600. Illustrative gases can include, but are not limited to one or more precursors, reductants, catalysts, carriers, purge, cleaning, or any mixture or combination thereof. Typically, the one or more gases introduced to the processing chamber 600 flow into plasma volume 661 through aperture (s) 651 in top plate 650. Alternatively or in combination, processing gases may be introduced more directly through aperture(s) 652 into processing region 640. Aperture(s) 652 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 600. Depending on the process, any number of gases can be delivered to the processing chamber 600, and can be mixed either in the processing chamber 600 or before the gases are delivered to the processing chamber 600.

The lid assembly 602 can further include an electrode 645 to generate a plasma of reactive species within the lid assembly 602. In one embodiment, the electrode 645 is supported by top plate 650 and is electrically isolated therefrom by inserting electrically isolating ring(s) 647 made from aluminum oxide or any other insulating and process compatible material. In one or more embodiments, the electrode 645 is coupled to a power source 646 while the rest of lid assembly 602 is connected to ground. Accordingly, a plasma of one or more process gases can be generated in remote plasma region composed of volumes 661, 662 and/or 663 between electrode 645 and annular mounting flange 622. In embodiments, annular mounting flange comprises or supports gas delivery plate 620. For example, the plasma may be initiated and maintained between electrode 645 and one or both blocker plates of blocker assembly 630. Alternatively, the plasma can be struck and contained between the electrode 645 and gas delivery plate 620, in the absence of blocker assembly 630. In either embodiment, the plasma is well confined or contained within the lid assembly 602. Accordingly, the plasma is a "remote plasma" since no active plasma is in direct contact with the substrate disposed within the chamber body 612. As a result, plasma damage to the substrate may be avoided since the plasma is separated from the substrate surface.

A wide variety of power sources 646 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 600. Exemplary remote plasma generators are available from vendors such as MKS Instruments, Inc. and Advanced Energy Industries, Inc. In the exemplary processing system an RF power supply is coupled to electrode 645. A higher-power microwave power source 646 is beneficial in the event that reactive oxygen will also be produced using power source 646.

The temperatures of the process chamber body 612 and the substrate may each be controlled by flowing a heat transfer medium through chamber body channel 613 and support assembly channel 604, respectively. Support assembly channel 604 may be formed within support assembly 610 to facilitate the transfer of thermal energy. Chamber body 612 and support assembly 610 may be cooled or heated independently. For example, a heating fluid may be flown through one while a cooling fluid is flown through the other.

Other methods may be used to control the substrate temperature. The substrate may be heated by heating the support assembly 610 (or a portion thereof, such as a pedestal) with a resistive heater or by some other means. In another configuration, gas delivery plate 620 may be maintained at a temperature higher than the substrate and the substrate can be elevated in order to raise the substrate temperature. In this case the substrate is heated radiatively or by using a gas to conduct heat from gas delivery plate 620 to the substrate. The substrate may be elevated by raising support assembly 610 or by employing lift pins.

During the etch processes described herein, chamber body 612 may be maintained within an approximate temperature range of between 50° C. and 80° C., between 55° C. and 75° C. or between 60° C. and 70° C. in different embodiments. During exposure to plasma effluents and/or oxidizing agents, the substrate may be maintained below about 100° C., below about 65° C., between about 15° C. and about 50° C. or between about 22° C. and about 40° C. in different embodiments. The substrate may also be held at elevated temperatures during the etch to further decrease the size of solid by-product grains. During the SiConi™ etch, the substrate may be maintained between about 40° C. and about 90° C., between about 50° C. and about 85° C. or between about 60° C. and about 80° C. in different embodiments.

Plasma effluents include a variety of molecules, molecular fragments and ionized species. Currently entertained theoretical mechanisms of SiConi™ etching may or may not be entirely correct but plasma effluents are thought to include $NH_4F$ and $NH_4F \cdot HF$ which react readily with low temperature substrates described herein. Plasma effluents may react with a silicon oxide surface to form $(NH_4)_2SiF_6$, $NH_3$ and $H_2O$ products. The $NH_3$ and $H_2O$ are vapors under the processing conditions described herein and may be removed from processing region 640 by vacuum pump 625. A thin discontinuous layer of $(NH_4)_2SiF_6$ solid by-products is left behind on the substrate surface.

Following exposure to plasma effluents and the associated accumulation of solid by-products, the substrate may be heated to remove the by-products. In embodiments, the gas delivery plate 620 is heatable by incorporating heating element 670 within or near gas delivery plate 620. The substrate may be heated by reducing the distance between the substrate and the heated gas delivery plate. The gas delivery plate 620 may be heated to between about 100° C. and 150° C., between about 110° C. and 140° C. or between about 120° C. and 130° C. in different embodiments. By reducing the separation between the substrate and the heated gas delivery plate, the substrate may be heated to above about 75° C., above about 90° C., above about 100° C. or between about 115° C. and about 150° C. in different embodiments. The heat radiated from gas delivery plate 620 to the substrate should be made sufficient to dissociate or sublimate solid $(NH_4)_2SiF_6$ on the substrate into volatile $SiF_4$, $NH_3$ and HF products which may be pumped away from processing region 640.

During a hydrogen-starved etch process, nitrogen trifluoride (or another fluorine-containing precursor) may be flowed into remote plasma volume 661 at rates between about 25 sccm and about 200 sccm, between about 50 sccm and about 150 sccm or between about 75 sccm and about 125 sccm in different embodiments. Ammonia (or hydrogen-containing precursors in general) may be flowed into remote plasma volume 661 at rates below or about 200 sccm, below or about 150 sccm, below or about 100 sccm, below or about 75 sccm, below or about 50 sccm or below or about 25 sccm in different embodiments.

During a fluorine-starved etch process, ammonia (or hydrogen-containing precursors in general) may be flowed into remote plasma volume 661 at rates between about 50 sccm and about 300 sccm, between about 75 sccm and about 250 sccm, between about 100 sccm and about 200 sccm or between about 120 sccm and about 170 sccm in different embodiments. Nitrogen trifluoride (or fluorine-containing precursors in general) may be flowed into remote plasma volume 661 at rates below or about 100 sccm, below or about 75 sccm, below or about 50 sccm, below or about 25 sccm or below or about 15 sccm in different embodiments.

Combined flow rates of hydrogen-containing and fluorine-containing precursors into the remote plasma region may account for 0.05% to about 20% by volume of the overall gas mixture; the remainder being a carrier gas. In one embodiment, a purge or carrier gas is first initiated into the remote plasma region before those of the reactive gases to stabilize the pressure within the remote plasma region.

Production of the plasma effluents occurs within volumes 661, 662 and/or 663 by applying plasma power to electrode 645 relative to the rest of lid assembly 602. Plasma power can be a variety of frequencies or a combination of multiple frequencies. In the exemplary processing system the plasma is provided by RF power delivered to electrode 645. The RF power may be between about 1 W and about 1000 W, between about 5 W and about 600 W, between about 10 W and about 300 W or between about 20 W and about 100 W in different embodiments. The RF frequency applied in the exemplary processing system may be less than about 200 kHz, less than about 150 kHz, less than about 120 kHz or between about 50 kHz and about 90 kHz in different embodiments.

Processing region 640 can be maintained at a variety of pressures during the flow of ozone, oxygen, carrier gases and/or plasma effluents into processing region 640. The pressure may be maintained between about 500 mTorr and about 30 Torr, between about 1 Ton and about 10 Torr or between about 3 Ton and about 6 Torr in different embodiments. Lower pressures may also be used within processing region 640. The pressure may be maintained below or about 500 mTorr, below or about 250 mTorr, below or about 100 mTorr, below or about 50 mTorr or below or about 20 mTorr in different embodiments.

In one or more embodiments, the processing chamber 600 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum.

FIG. 7 is a schematic top-view diagram of an illustrative multi-chamber processing system 700. The system 700 can include one or more load lock chambers 702, 704 for transferring of substrates into and out of the system 700. Typically, since the system 700 is under vacuum, the load lock chambers 702, 704 may "pump down" the substrates introduced into the system 700. A first robot 710 may transfer the substrates between the load lock chambers 702, 704, and a first set of one or more substrate processing chambers 712, 714, 716, 718 (four are shown). Each processing chamber 712, 714, 716, 718, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 710 can also transfer substrates to/from one or more transfer chambers 722, 724. The transfer chambers 722, 724 can be used to maintain ultrahigh vacuum conditions while allowing substrates to be transferred within the system 700. A second robot 730 can transfer the substrates between the transfer chambers 722, 724 and a second set of one or more processing chambers 732, 734, 736, 738. Similar to processing chambers 712, 714, 716, 718, the processing chambers 732, 734, 736, 738 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 712, 714, 716, 718, 732, 734, 736, 738 may be removed from the system 700 if not necessary for a particular process to be performed by the system 700.

An ozone generator 751 may be positioned outside the clean room and supply lines carry process gases from the ozonator 751 to a process chamber 734 used for an oxidizing-SiConi™ process described herein. A remote plasma system (RPS) 753 may be positioned remotely or integrated (as shown) with the SiConi™ processing chamber 734. Alternatively, the RPS 753 may be a separate from but in close proximity or even physically attached to processing chamber 734. The reactive oxygen excited within RPS 753 may be introduced more directly (e.g. through aperture(s) 752) into processing region 740 whereas other process gases from gas handling system 755 are introduced through apertures 651, excited by remote plasma(s) within process volumes 661, 662 and/or 663.

System controller 757 is used to control motors, valves, flow controllers, power supplies and other functions required to carry out process recipes described herein. System controller 757 may rely on feedback from optical sensors to determine and adjust the position of movable mechanical assemblies. Mechanical assemblies may include the robot, throttle valves and susceptors which are moved by motors under the control of system controller 757.

In an exemplary embodiment, system controller 757 includes a hard disk drive (memory), USB ports, a floppy disk drive and a processor. System controller 757 includes analog and digital input/output boards, interface boards and stepper motor controller boards. Various parts of multi-chamber processing system 700 which contains processing chamber 700 are controlled by system controller 757. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A gas in an "excited state" describes a gas wherein at least some of the gas molecules are in vibrationally-excited, dissociated and/or ionized states. A gas may be a combination of two or more gases. The term trench is used throughout with no implication that the etched geometry has a large horizontal aspect ratio. Viewed from above the surface, trenches may appear circular, oval, polygonal, rectangular, or a variety of other shapes. "Pulsing" the plasma may comprise alternating the plasma power between a non-zero value and a relatively low value wherein the relatively low value results in very little growth of solid residue. "Pulsing" the plasma may also comprise alternating the flow of one or both precursors between non-zero values and relatively low values; relatively low flow rates substantially reduce the progress of the etch process between pulses. Alternating the plasma power and alternating the flow rates may be used separately or in combination with one another.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a silicon-containing layer on a surface of a substrate in a substrate processing region of a substrate processing chamber, wherein the method leaves a relatively smooth post-etch surface, the method comprising:
    flowing a fluorine-containing precursor and a hydrogen-containing precursor into a first remote plasma region fluidly coupled to the substrate processing region while forming a plasma in the first plasma region to produce plasma effluents, wherein a flow rate of the fluorine-containing precursor and a flow rate of the hydrogen-containing precursor result in a hydrogen-to-fluorine atomic flow ratio of less than 1:2;
    etching the silicon-containing layer by flowing the plasma effluents into the substrate processing region while forming solid by-products on the surface of the substrate; and
    sublimating the solid by-products to leave the relatively smooth post-etch surface by increasing a temperature of the substrate above a sublimation temperature of the solid by-products.

2. The method of claim 1 wherein the fluorine-containing precursor comprises at least one precursor selected from the group consisting of nitrogen trifluoride, hydrogen fluoride, diatomic fluorine, monatomic fluorine and fluorine-substituted hydrocarbons.

3. The method of claim 1 wherein the hydrogen-containing precursor comprises at least one precursor selected from the group consisting of atomic hydrogen, molecular hydrogen, ammonia, a hydrocarbon and an incompletely halogen-substituted hydrocarbon.

4. The method of claim 1 wherein the silicon-containing layer is maintained above or about 50° C. during the etching operation.

5. The method of claim 1 wherein the operations of etching the silicon-containing layer and sublimating the solid by-products comprise a step and an integral number of steps are used to reduce the amount of material removed during each cycle.

6. The method of claim 5 wherein a total thickness of the silicon-containing layer is removed in three steps and each step removes 20% to 40% of the total thickness.

7. The method of claim 5 each step removes about 150 Å or less from the silicon-containing layer.

8. The method of claim 1 wherein the silicon-containing layer comprises silicon oxide.

9. A method of etching a silicon-containing layer on a surface of a substrate in a substrate processing region of a substrate processing chamber, wherein the method reduces a difference in etch-rate between a densely patterned area and a sparsely patterned area, the method comprising:
    flowing a fluorine-containing precursor and a hydrogen-containing precursor into a first remote plasma region fluidly coupled to the substrate processing region while forming a plasma in the first plasma region to produce plasma effluents, wherein a flow rate of the fluorine-containing precursor and a flow rate of the hydrogen-containing precursor result in a hydrogen-to-fluorine atomic flow ratio of less than 1:2;
    etching the silicon-containing layer in the densely patterned area and the sparsely patterned area by flowing the plasma effluents into the substrate processing region while forming solid by-products on the surface of the substrate; and
    sublimating the solid by-products by increasing a temperature of the substrate above a sublimation temperature of the solid by-products.

10. The method of claim 9 wherein the fluorine-containing precursor comprises at least one precursor selected from the group consisting of nitrogen trifluoride, hydrogen fluoride, diatomic fluorine, monatomic fluorine and fluorine-substituted hydrocarbons.

11. The method of claim 9 wherein the hydrogen-containing precursor comprises at least one precursor selected from the group consisting of atomic hydrogen, molecular hydrogen, ammonia, a hydrocarbon and an incompletely halogen-substituted hydrocarbon.

12. The method of claim 9 wherein the operations of etching the silicon-containing layer and sublimating the solid by-products comprise a step and an integral number of steps are used to reduce the amount of material removed during each cycle.

13. The method of claim 12 wherein a total thickness is removed from the silicon-containing layer in three steps and each step removes 20% to 40% of the total thickness.

14. The method of claim 12 wherein each step removes about 100 Å or less from the silicon-containing layer.

15. The method of claim 9 wherein the flow rate of the fluorine-containing precursor and the flow rate of the hydrogen-containing precursor result in a hydrogen-to-fluorine atomic flow ratio of less than 1:4.

16. The method of claim 9 wherein the silicon-containing layer comprises silicon oxide.

17. A method of etching a silicon-containing layer on a surface of a substrate in a substrate processing region of a substrate processing chamber, the method comprising:
    flowing a fluorine-containing precursor and a hydrogen-containing precursor into a first remote plasma region fluidly coupled to the substrate processing region while forming a train of plasma pulses in the first plasma region to produce plasma effluents, wherein a flow rate of the fluorine-containing precursor and a flow rate of the hydrogen-containing precursor result in a hydrogen-to-fluorine atomic flow ratio of less than 1:2;
    etching the silicon-containing layer by flowing the plasma effluents into the substrate processing region while forming solid by-products on the surface of the substrate; and
    sublimating the solid by-products by increasing a temperature of the substrate above a sublimation temperature of the solid by-products.

18. The method of claim 17 wherein the train of plasma pulses are created by pulsing the plasma power applied to the first plasma region.

19. The method of claim 18 wherein a flow of the hydrogen-containing precursor and a flow of the fluorine-containing precursor are both constant during the etching operation.

20. The method of claim 17 wherein the train of plasma pulses are created by pulsing the flow of at least one of a flow of the fluorine-containing precursor and a flow of the hydrogen-containing precursor.

21. The method of claim 17 wherein the operation of sublimating the solid by-products comprises multiple substrate anneals which occur following each of the plasma pulses.

22. The method of claim 17 wherein a repetition frequency of the train of plasma pulses is between about 0.1 Hz and about 1.0 Hz.

* * * * *